(12) United States Patent  (10) Patent No.: US 6,181,146 B1
Koyama  (45) Date of Patent: *Jan. 30, 2001

(54) BURN-IN BOARD

(75) Inventor: Toshio Koyama, Tateyama (JP)

(73) Assignee: Nippon Steel Semiconductor Corp. (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/791,665

(22) Filed: Jan. 30, 1997

(30) Foreign Application Priority Data

Apr. 30, 1996 (JP) .................................................. 8-132881

(51) Int. Cl.[7] .................................................. G01R 15/12
(52) U.S. Cl. .................................................. 324/755; 324/760
(58) Field of Search .................................................. 324/755, 158.1, 324/73.1, 537, 754, 761; 361/700–800

(56) References Cited

U.S. PATENT DOCUMENTS

| | | | |
|---|---|---|---|
| 3,870,953 | 3/1975 | Boatman et al. | 324/73.1 |
| 4,150,331 | 4/1979 | Lacher | 324/73.1 |
| 4,196,386 | 4/1980 | Phelps | 324/73.1 |
| 4,211,917 | 7/1980 | Hofmann | 324/73.1 |
| 4,348,636 | 9/1982 | Doundoulakis | 324/73.1 |
| 4,924,179 | * 5/1990 | Sherman | 324/537 |
| 5,659,245 | * 8/1997 | Ping et al. | 324/755 |
| 5,694,049 | * 12/1997 | Singh et al. | 324/755 |

FOREIGN PATENT DOCUMENTS 6-232227   8/1994   (JP) .

* cited by examiner

*Primary Examiner*—Vinh P. Nguyen
(74) *Attorney, Agent, or Firm*—Holland & Hart LLP

(57) ABSTRACT

A burn-in board Vcc circuit changeover socket 204A and a GND circuit changeover socket 205A wich are arranged in a wiring area between terminals 1 to 7 of an IC socket 202 and resistors 203 corresponding to these terminals. A Vcc circuit changeover socket 204B and a GND circuit changeover socket 205B are arranged in a wiring area between terminals 8 to 14 of the IC socket 202 and resistors 203 corresponding to these terminals. A Vcc circuit changeover unit 206 is fitted, for example, in the Vcc circuit changeover socket 204A and a GND circuit changeover unit 207 is fitted, for example, in the GND circuit changeover socket 205B. A first electric potential (Vcc) is supplied to the terminals 5 and 7 of the IC socket 202, and a second electric potential (GND) is supplied to the terminals 12 and 14 of the IC socket 202. The Vcc circuit changeover unit 206 and the GND circuit changeover unit 207 may have different plug-in terminals according to kinds of ICs which may be made.

6 Claims, 7 Drawing Sheets

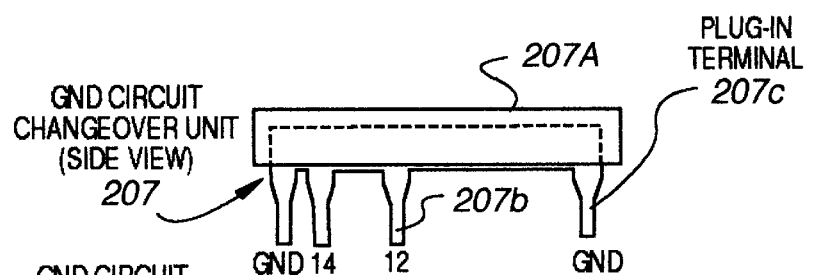
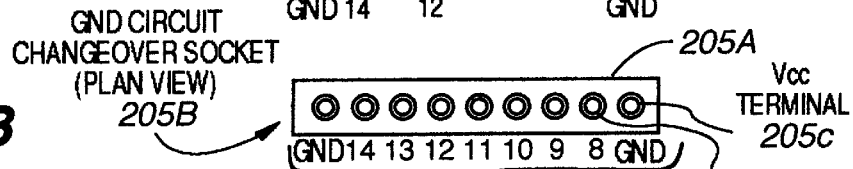
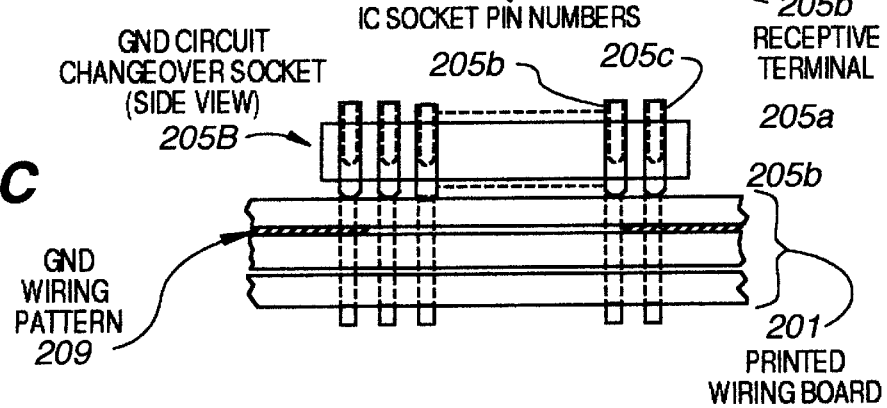
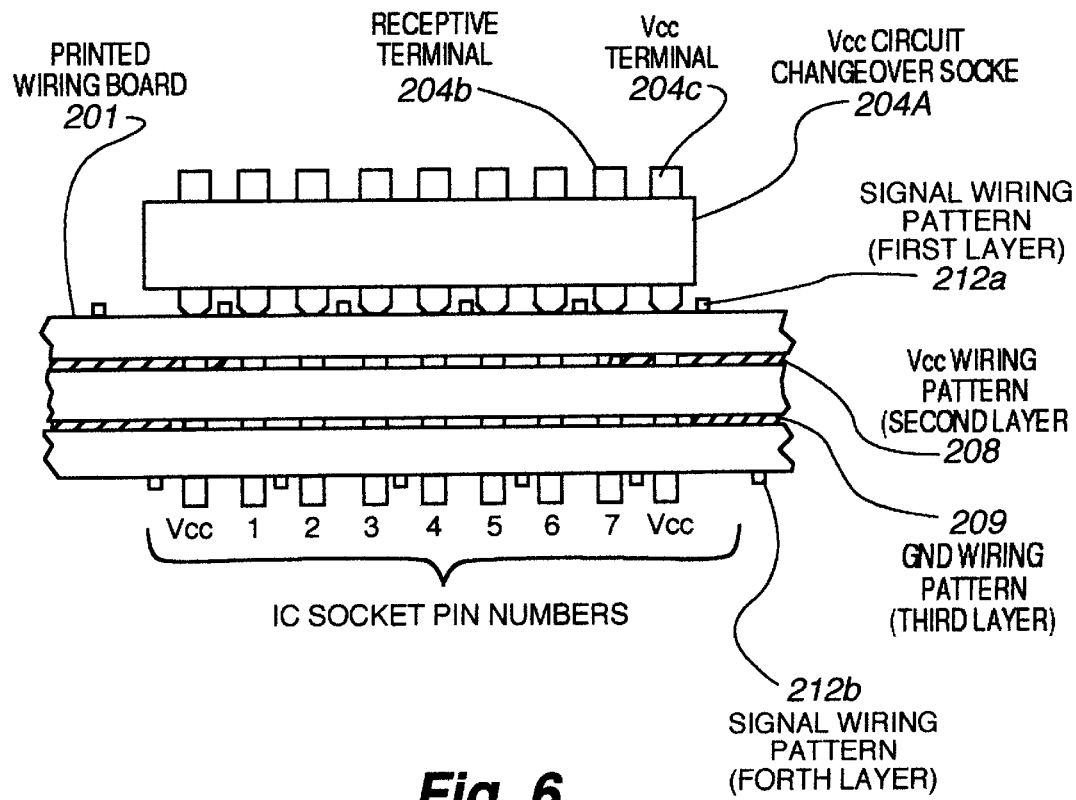

BURN-IN BOARD

BACKGROUND OF THE INVENTION

1. Field of the Invention

The present invention relates to a burn-in board used in a burn-in test on a semiconductor product, and particularly to a burn-in board which single makes it possible to perform a burn-in test on plural kinds of semiconductor products which are equal to one another in their package and the number of pins.

2. Prior Art

In order to secure quality and reliability of a semiconductor product, a burn-in test is performed as a kind of screening tests for removing a product having a potential defect. In the burn-in test, a burn-in board is used as a board for accommodating a number of devices to be tested and the burn-in board is accommodated in a burn-in chamber and then the test is performed.

In an existing burn-in board, different kinds of devices to be tested (semiconductor products) which are equal to one another in their package and the number of pins are different in electric test conditions, and therefore, it has been necessary to change over the test circuits and so some additional boards have had to be prepared. As a method for solving such a problem, up to now, a technique is known which has been disclosed in a Japanese laid-open publication Tokkaihei No. 3-170078.

A burn-in board 100 disclosed in this publication has plural (four) IC sockets 102 on a printed wiring board 101 as shown by an external view in FIG. 8 and a circuit diagram in FIG. 9. Each of the IC sockets 102 is provided with fourteen terminals (pins) represented by numbers 1 to 14, where the terminals of numbers 1 to 6 have the corresponding signals 1 to 6 inputted to them through the respective resistors 103 and the terminals of numbers 8 to 13 have the corresponding signals 8 to 13 inputted to them through the respective resistors 103. And the terminal of number 14 is connected to a first power source (Vcc) 107 through a circuit changeover socket 104. The terminal of number 7 is connected to a second power source (the ground potential GND) 108. The circuit changeover socket 104 can put on and off selectively either one of circuit changeover units 105a and 105b. The circuit changeover socket 105a has resistors 106 and the circuit changeover socket 105b has no resistor.

This burn-in board 100 makes it possible to change a circuit (insert or remove the resistors 106 in this example) by wiring a circuit part common to plural kinds of burn-in boards as it is on the single printed wiring board 101 and collecting one-end parts of other circuit wirings than the common part at a part (circuit changeover socket 104) of the printed wiring board 101 and then putting on or off either one of the circuit changeover units 105a and 105b which have, respectively, other circuits than the common circuit.

By means of such a composition, the existing burn-in board 100 makes it possible to perform a burn-in test on plural kinds of semiconductor products which are equal to one another in the package and the number of pins.

In the existing burn-in board 100, however, since one-end parts of other circuit wirings than the common circuit part are collected at a part of the single printed wiring board, wiring length of other circuits than the common circuit on the printed wiring board 101 cannot help being longer when the wiring is drawn from an IC socket 102 more distant from the circuit changeover socket 104. And there has been a problem that a limit of expansion of a wiring pattern width due to its close pattern increases a signal noise and can have a bad influence upon devices to be tested (semiconductor products).

And some recent products have plural Vcc and GND power sources, where drawing around of the wiring comes to be complicated when collecting one-end parts of other circuit wirings than the common circuit part at a part of the printed wiring board 101. Moreover, the existing burn-in board 100 has had another problem that manners of change of circuits are greatly limited since only wirings of other circuit parts than the common circuit part can be changed.

SUMMARY OF THE INVENTION

The present invention has been performed in consideration of such problems, and an object of the invention is to provide a burn-in board which can shorten wiring length of other circuit parts than the common circuit part, expand a wiring pattern width, reduce a signal noise, and can diversify manners of change of circuits.

A burn-in board according to the present invention comprises;

a tested device accommodating part which accommodates tested devices each of which has plural terminals, and which has plural test terminals to be electrically connected with the terminals of the tested devices accommodated in it, a signal supplying means for supplying a signal to test terminals of said tested device accommodating part, a first electric potential supplying means for supplying a first test electric potential to other test terminals of said tested device accommodating part, a second electric potential supplying means for supplying a second test electric potential different from the first electric potential to test terminals of said tested device accommodating part, and a test circuit changeover means which is provided near said tested device accommodating part and which can change a test circuit according to kinds of tested devices by selectively changing over the electric potentials supplied from said first and said second electric potential supplying means to the respective test terminals of said tested device accommodating part.

This burn-in board can change a test circuit by selectively changing over the electric potentials supplied from the first and the second electric potential supplying means to the respective test terminals of the tested device accommodating part according to kinds of tested devices by means of the test circuit changeover means.

A burn-in board as defined in claim 2 is a burn-in board as defined in claim 1, wherein said test circuit changeover means comprises;

a first circuit changeover socket having plural first receptive terminals electrically connected, respectively, with plural test terminals of the tested device accommodating part and a first electric potential terminal electrically connected with a first electric potential supplying means, a second circuit changeover socket having plural second receptive terminals electrically connected, respectively, with plural test terminals of the tested device accommodating part and a second electric potential terminal electrically connected with a second electric potential supplying means, a first circuit changeover unit having plug-in terminals for electrically connecting the first electric potential terminals of the first circuit changeover socket with either receptive terminals corresponding to a test circuit out of the first receptive terminals, and a second circuit changeover unit having plug-in terminals for electrically connecting the second electric potential terminals of the second circuit changeover socket with either receptive terminals corresponding to a test circuit out of the second receptive terminals.

In this burn-in board, the first electric potential terminals of the first circuit changeover socket are electrically connected with either receptive terminals corresponding to a test circuit out of the first receptive terminals by inserting the plug-in terminals of the first circuit changeover unit into the first receptive terminals and the first electric potential terminals of the first circuit changeover socket. Namely, either receptive terminals corresponding to the test circuit out of the first receptive terminals of the first circuit changeover socket are set at the first electric potential. In such a way, specific terminals out of the plural terminals of a tested device accommodated in the tested device accommodating part are set at the first electric potential. In the same way, the second electric potential terminals of the second circuit changeover socket are electrically connected with either receptive terminals corresponding to a test circuit out of the second receptive terminals by inserting the plug-in terminals of the second circuit changeover unit into the second receptive terminals and the second electric potential terminals of the second circuit changeover socket. Namely, either receptive terminals corresponding to the test circuit out of the second receptive terminals of the second circuit changeover socket are set at the second electric potential. In such a way, specific terminals out of the plural terminals of a tested device accommodated in the tested device accommodating part are set at the second electric potential. Thus, a specified voltage (a potential difference between the first and the second potential) comes to be applied to the devices to be tested between these terminals.

In this burn-in board, it is possible to cope with change of circuits for plural kinds of tested devices by preparing in advance plural different pin configurations according to kinds of test circuits for the first and the second circuit changeover unit.

A burn-in board as defined in claim 3 is a burn-in board as defined in claim 2, wherein;

plural test terminals are arranged respectively at both sides of the tested device accommodating part, and the first and the second circuit changeover socket are arranged corresponding to the respective terminal lines at both sides of the tested device accommodating part.

A burn-in board as defined in claim 4 is a burn-in board as defined in claim 2, wherein;

plural signal wirings corresponding to the test terminals of the tested device accommodating part, a first wiring between said first electric potential supplying means and the first electric potential terminal of said first circuit changeover socket, and a second wiring between said second electric potential supplying means and the second electric potential terminal of said second circuit changeover socket are formed respectively on layers different from one another on the printed wiring board, and the first and the second wiring pattern can be formed as widely as possible, where the voltage drop and noises in them can be reduced.

BRIEF DESCRIPTION OF THE DRAWINGS

FIG. 5 is a figure for explaining a concrete composition of a GND circuit changeover device in the burn-in board in FIG. 1.

FIG. 6 is a side view for explaining a layered wiring structure in the burn-in board in FIG. 1.

DESCRIPTION OF THE PREFERRED EMBODIMENT

Figure 1:
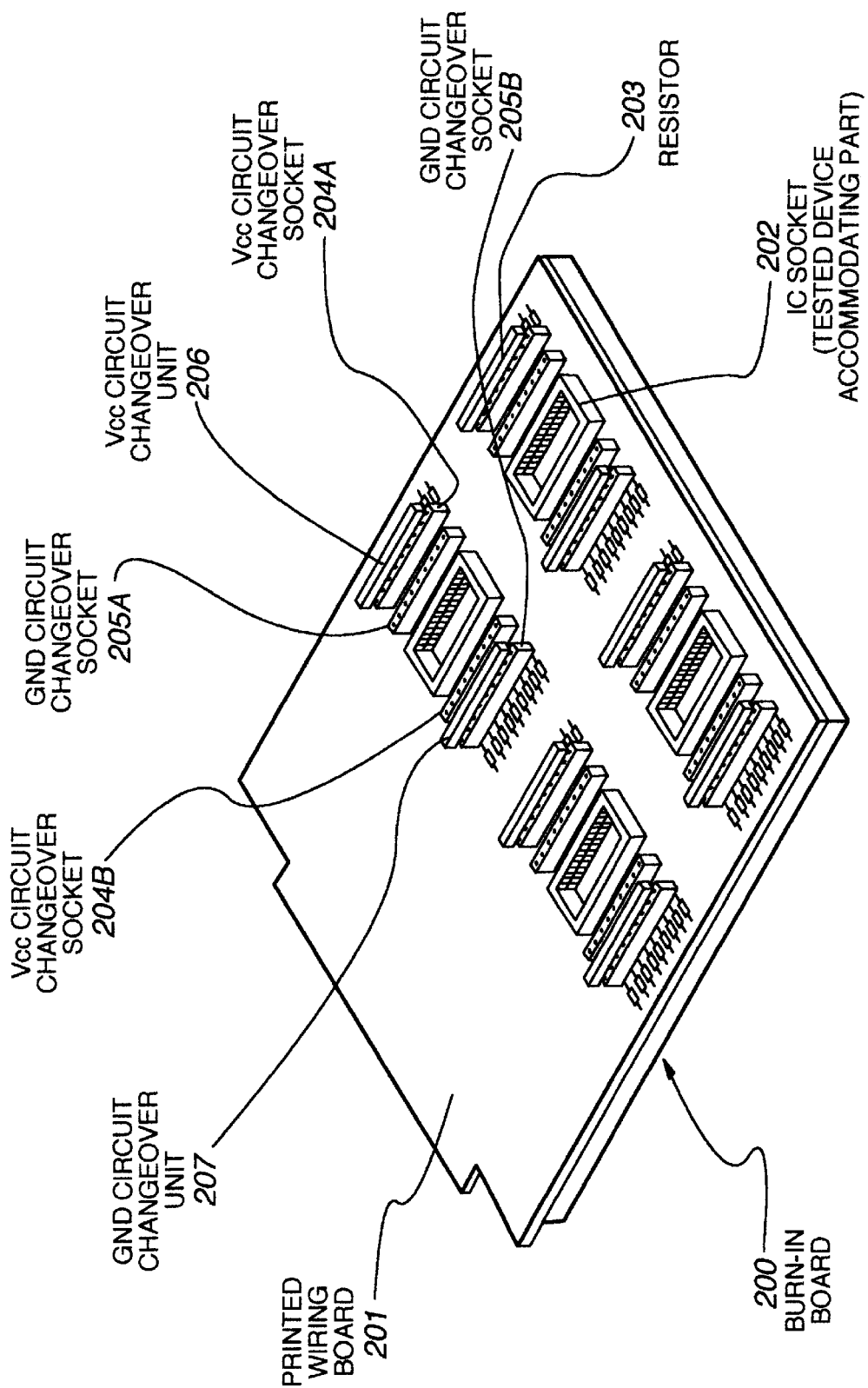
FIG. 1 is a compositional figure showing an external appearance of a burn-in board of the present invention.
Figure 2:
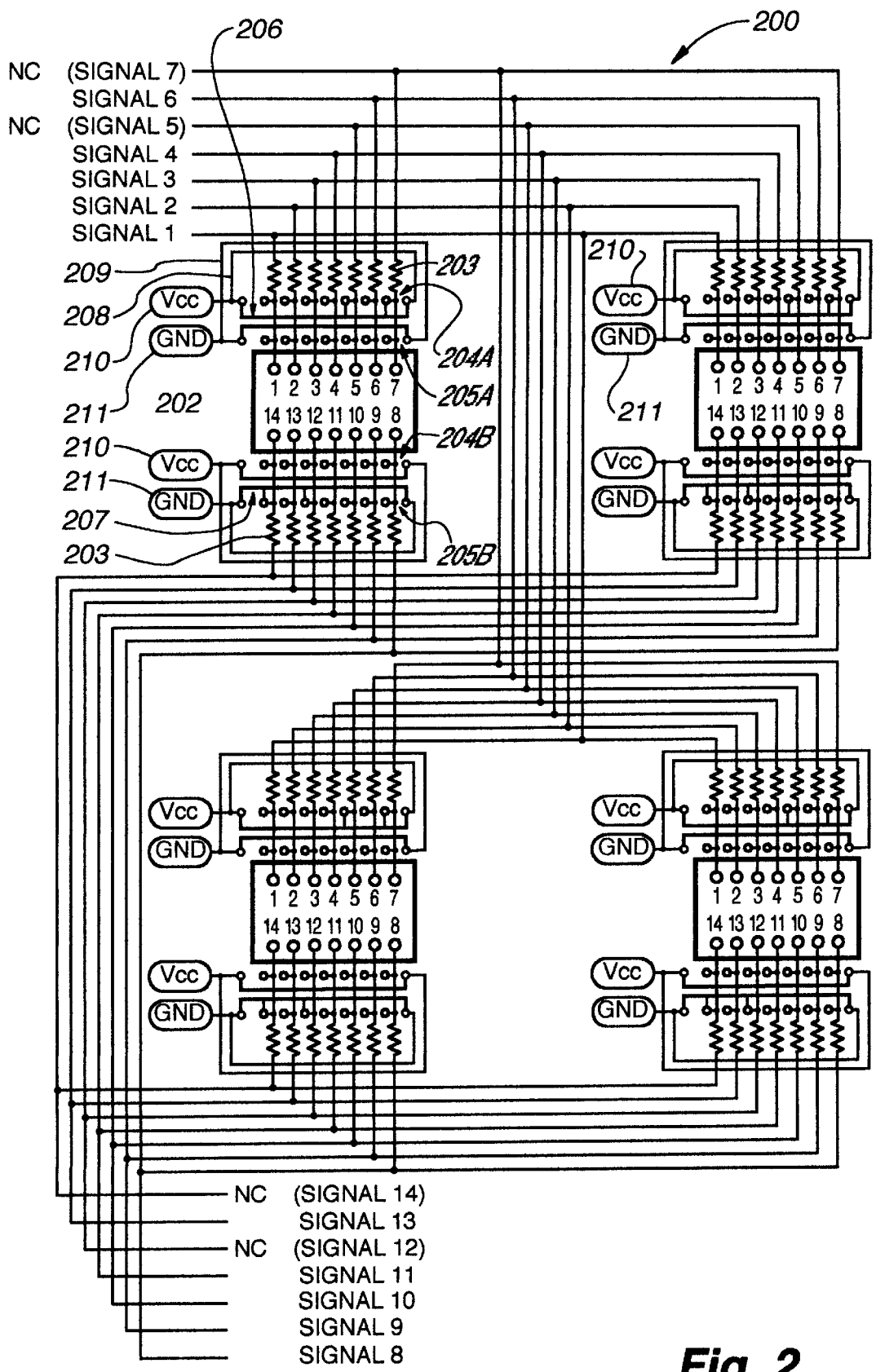
FIG. 2 is a circuit diagram of the burn-in board in FIG. 1.

An embodiment of the present invention is described in detail with reference to the drawings. FIG. 1 shows an external appearance of a burn-in board 200 of an embodiment of the invention. FIG. 2 is a circuit diagram of the burn-in board 200. The burn-in board 200 is provided with plural, for example, four IC sockets 202 as tested device accommodating parts on a printed wiring board 201. Each of the IC sockets 202 is provided with fourteen test terminals (pins) represented by numbers 1 to 14, for example. The test terminals of numbers 1 to 7 are connected to signal lines so as to be connected with connector pins of input signals 1 to 7, respectively, through resistors 203, and the test terminals of numbers 8 to 14 are connected to signal lines so as to be connected with connector pins of corresponding input signals 8 to 14, respectively, through resistors 203. The plural resistors 203 are, respectively, soldered on the signal wiring pattern on the printed wiring board 201.

A Vcc circuit changeover socket 204A as a first circuit changeover socket and a GND circuit changeover socket 205A as a second circuit changeover socket are arranged in a wiring connection area between the test terminals of numbers 1 to 7 at one side of each of the IC sockets and the resistors 203 corresponding to these terminals on this burn-in board 200. On the other hand, a Vcc circuit changeover socket 204B as a first circuit changeover socket and a GND circuit changeover socket 205B as a second circuit changeover socket, in the same way as above, are arranged in a wiring connection area between the test terminals of numbers 8 to 14 at the other side of each of the IC sockets and the resistors 203 corresponding to these terminals.

Figure 3:
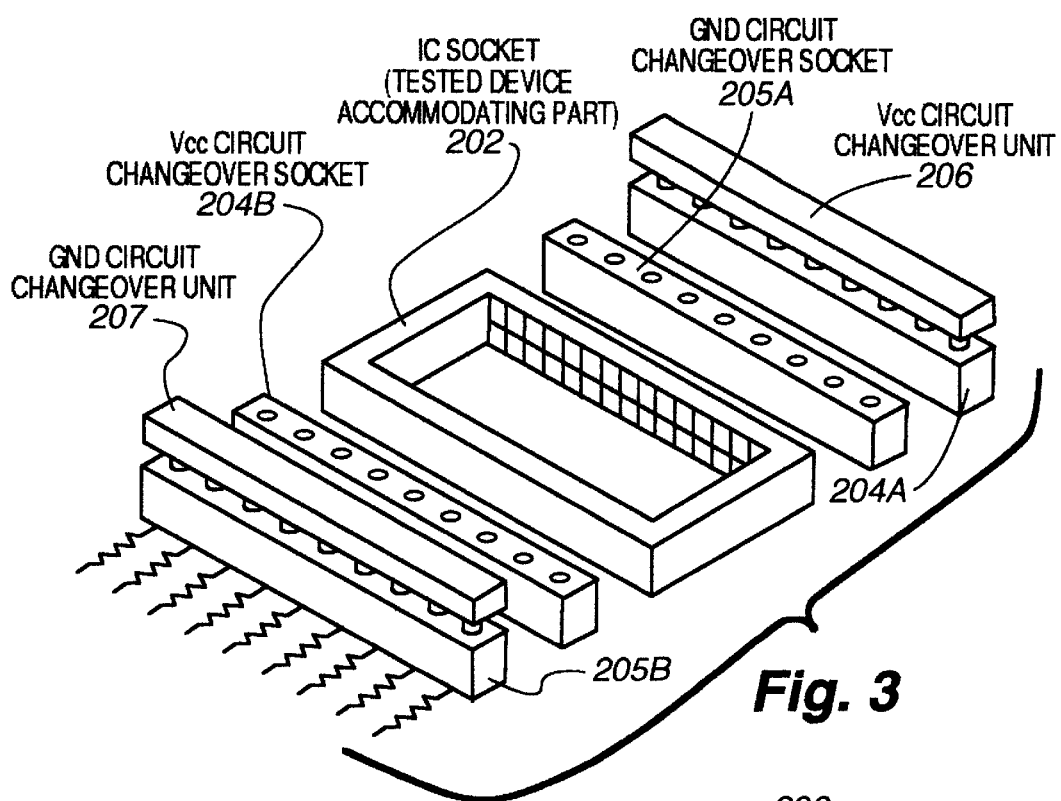
FIG. 3 is a perspective view of a magnified area around an IC socket of the burn-in board in FIG. 1.

A Vcc circuit changeover unit 206 as a first circuit changeover unit can be selectively mounted on and detached from the Vcc circuit changeover sockets 204A and 204B, and a GND circuit changeover unit 207 as a second circuit changeover unit can be selectively mounted on and detached from a GND circuit changeover sockets 205A and 205B. In this embodiment, it is assumed that a first electric potential (Vcc) is supplied to the test terminals of numbers 5 and 7 of the IC socket 202 and the ground potential (GND) is supplied to the test terminals of numbers 12 and 14 of the IC socket 202. As shown as a magnified view in FIG. 3, therefore, the Vcc circuit changeover unit 206 is mounted on the Vcc circuit changeover socket 204A and the GND circuit changeover unit 207 is mounted on the GND circuit changeover socket 205B. The Vcc circuit changeover sockets 204A and 204B and the Vcc circuit changeover unit 206 form a Vcc circuit changeover device. The GND circuit changeover sockets 205A and 205B and the GND circuit changeover unit 207 form a GND circuit changeover device.

Figure 4A:
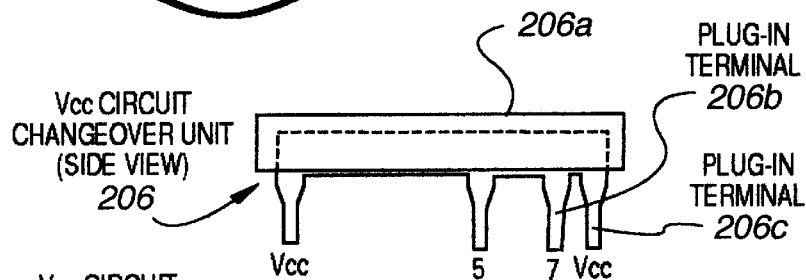
FIG. 4 is a figure for explaining a concrete composition of a Vcc circuit changeover device in the burn-in board in FIG. 1.
Figure 4B:
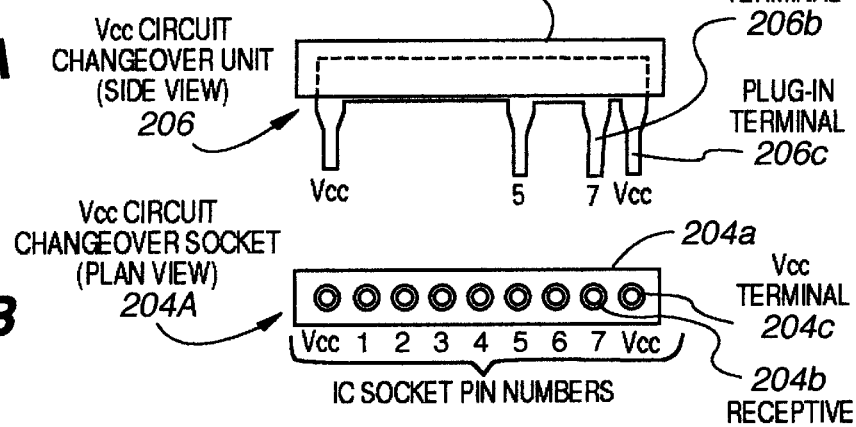
Figure 4C:
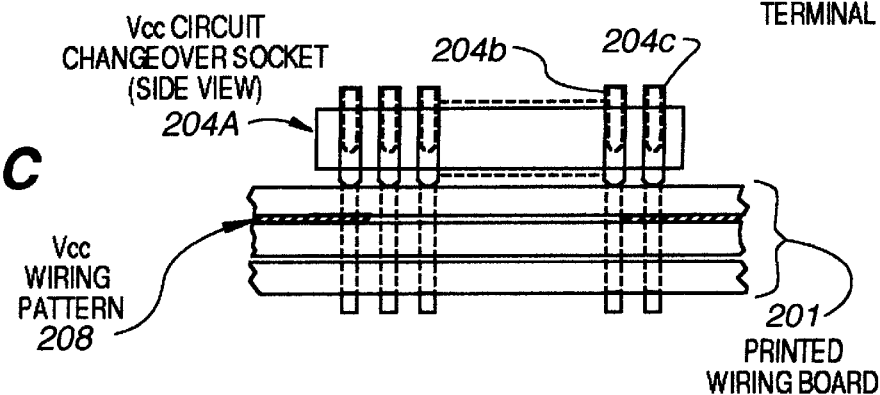
Figure 7:
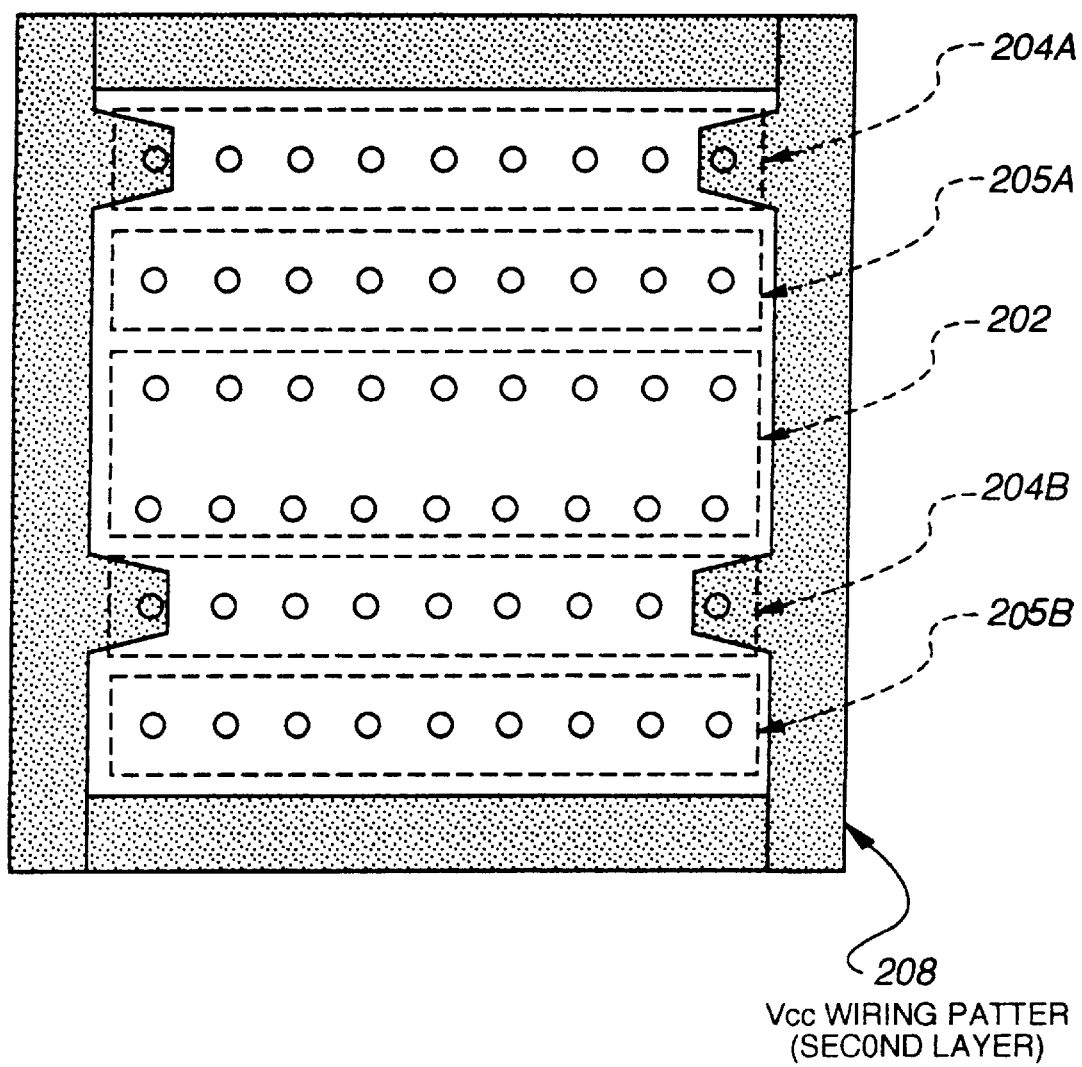
FIG. 7 is a plan view for showing a Vcc wiring pattern in the layered wiring structure shown in FIG. 6.
Figure 8:
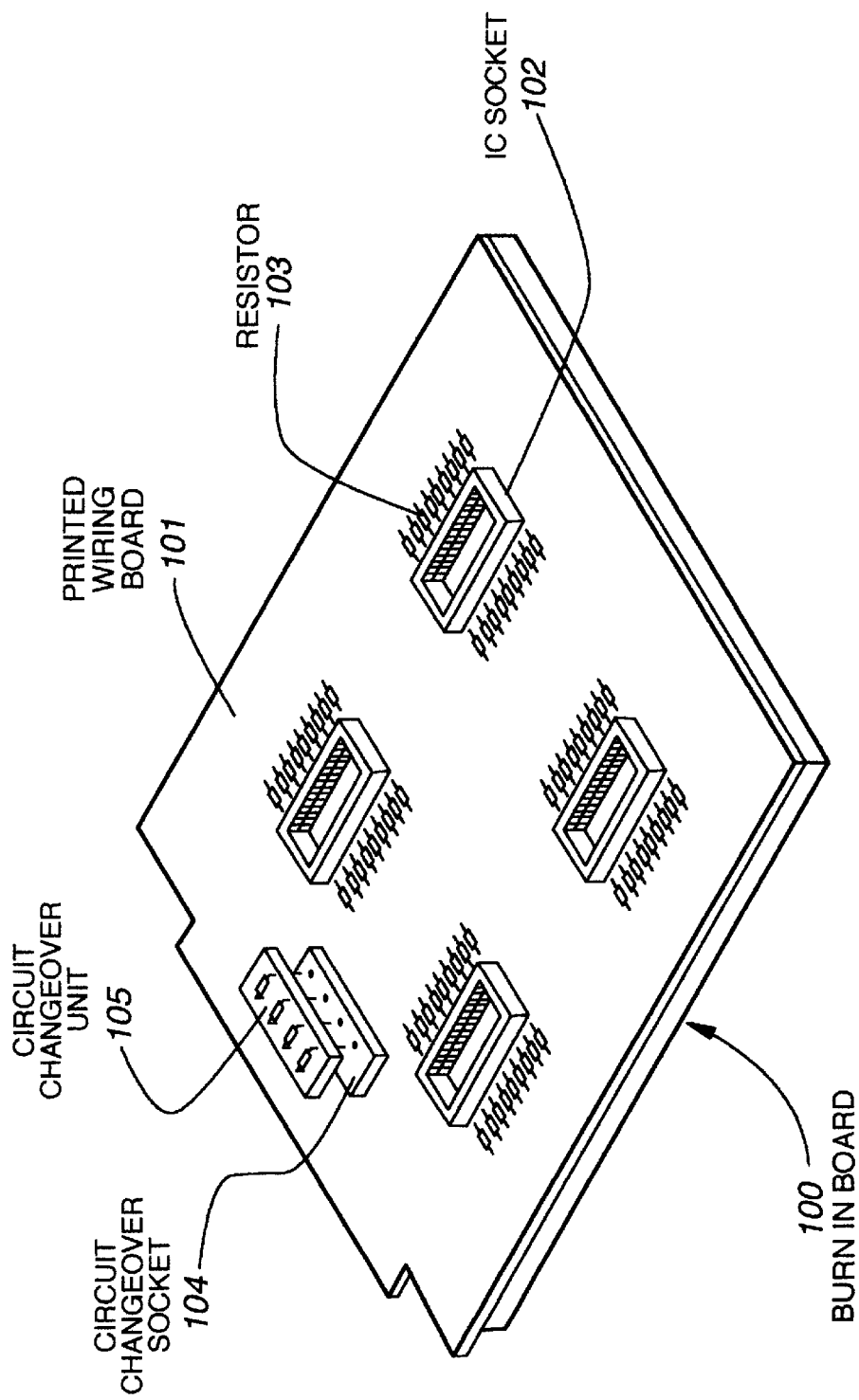
FIG. 8 is a perspective view showing an external appearance of an existing burn-in board.
Figure 9:
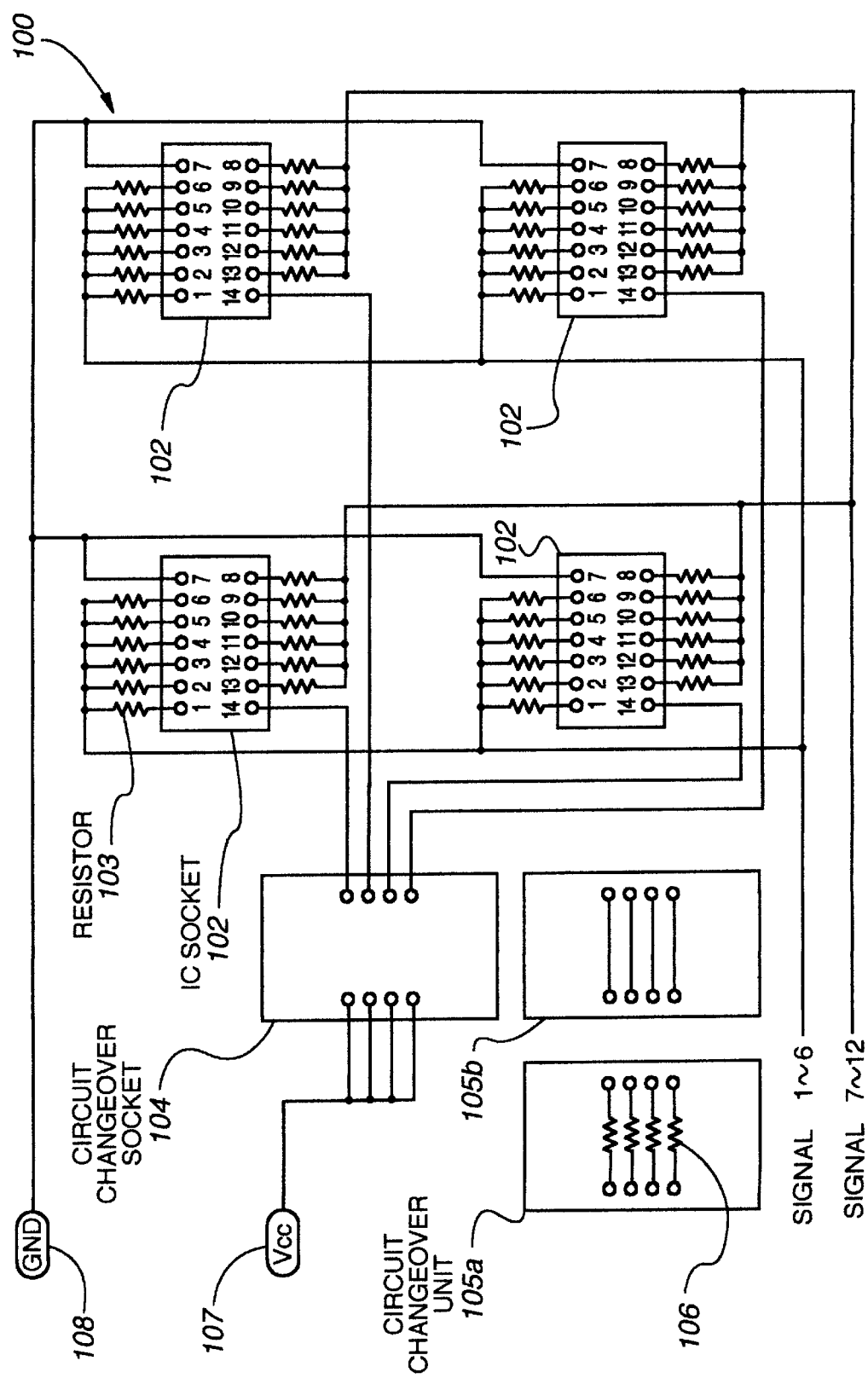
FIG. 9 is a circuit diagram of the existing burn-in board.

FIG. 4 shows a concrete composition of the Vcc circuit changeover device composed of the Vcc circuit changeover socket 204A and the Vcc circuit changeover unit 206 at one side (a side corresponding to terminal numbers 1 to 7) of the IC socket 202, and FIGS. 4(A), 4 (B), and 4(C) show, respectively, a side View of the Vcc circuit changeover unit 206, a plan view of the Vcc circuit changeover socket 204A, and a side view of the Vcc circuit changeover socket 204A set on the printed wiring board 201. Since the Vcc circuit changeover socket 204B is also composed in the same way as the Vcc circuit changeover socket 204A, description of the socket 204B is omitted.

The Vcc circuit changeover socket 204A has a structure where plural receptive terminals 204b (in this case, seven terminals to be connected to the terminals 1 to 7 out of the terminals 1 to 14 of the IC socket 202) are embedded in a line in its main body 204a made of an insulating material such as plastics in the shape of a rectangular parallelopiped. The main body 204a is furthermore provided with a Vcc terminal 204c as a first electric potential terminal at each end of the line of the seven receptive terminals 204b.

These Vcc terminals 204c are connected with a Vcc wiring pattern 208 formed on the printed wiring board 201 so as to surround the Vcc circuit changeover socket 204A. The receptive terminals 204b and the Vcc terminals 204c are respectively provided with the receptive holes, into which the respective plug-in terminals 206b and 206c of the Vcc circuit changeover unit 206 as described later can be inserted.

In this embodiment, the Vcc circuit changeover unit 206 is provided with two plug-in terminals 206b and two Vcc plug in terminals 206c which are formed in one body so that both of the test terminals 5 and 7 of the IC socket 202 can be electrically connected with a Vcc power source 210 as a first electric potential supplying means. The base end side of these plug-in terminals 206b and 206c is covered with the unit body 206a made of an insulating material, for example, plastics.

FIG. 5 shows a concrete composition of the GND circuit changeover socket 205B and the GND circuit changeover unit 207 at the other side (a side corresponding to terminal numbers 8 to 14) of the IC socket 202, and FIGS. 5 (A), 5(B), and 5(C) show, respectively a side view of the GND circuit changeover unit 207, a plan view of the GND circuit changeover socket 205B, and a side view of the GND circuit changeover socket 205B set on the printed wiring board 201. Since the GND circuit changeover socket 205A is also composed in the same way as the GND circuit changeover socket 205B, description of the socket 205A is omitted.

The GND circuit changeover socket 205B has a structure where plural receptive terminals 205b (in this case, seven terminals to be connected to the terminals 8 to 14 out of the terminals 1 to 14 of the IC socket 202) are embedded in a line in its main body 205a made of an insulating material such as plastics in the shape of a rectangular parallelopiped. The main body 205a is furthermore provided with a GND terminal 205c as a second electric potential terminal at each end of the line of the seven receptive terminals 205c. These GND terminals 205c are connected with a GND wiring pattern 209 formed on the printed wiring board 201 so as to surround the GND circuit changeover socket 205B. The receptive terminals 205b and the GND terminals 205c are respectively provided with the receptive holes, into which the respective plug-in terminals 207b and 207c of the GND circuit changeover unit 207 as described later can be inserted.

In this embodiment, the GND circuit changeover unit 207 is provided with two plug-in terminals 207b and two GND plug-in terminals 207c which are formed in one body so that both of the test terminals 12 and 14 of the IC socket 202 can be electrically connected with a GND power source 211 as a second electric potential supplying means. The base end side of these plug-in terminals 207b and 207c is covered with the unit body 207a made of an insulating material, for example, plastics.

In this embodiment, the terminals 5 and 7 of the IC socket 202 are connected with the Vcc power source 210 and the terminals 12 and 14 of the IC socket 202 are connected with the GND power source 211 (are grounded) by inserting the Vcc circuit changeover unit 206 into the Vcc circuit changeover socket 204A set on one side (the upper side in FIG. 2) of the IC socket 202 and inserting the GND circuit changeover unit 207 into the GND circuit changeover socket 205B set on the other side (the lower side in FIG. 2) of the IC socket 202.

The Vcc circuit changeover device and the GND circuit changeover device as composed in this manner are provided at both sides of each of the four IC sockets 202.

In the burn-in board 200 of this embodiment, as shown in FIG. 6, the circuit wiring on the printed wiring board 201 has a Vcc wiring pattern, a GND wiring pattern, and a signal wiring pattern which are respectively formed on different layers. Namely, the signal wiring pattern 212a, the Vcc wiring pattern 208, the GND wiring pattern 209, and the signal wiring pattern 212b are respectively formed on the first, the second, the third, and the fourth layer, where an insulating layer is put between the adjoining wiring pattern layers. Particularly, the Vcc wiring pattern 208 and the GND wiring pattern 209 are made as wide as possible in pattern width and formed so as to surround the IC socket 202 in the very close vicinity of it in order to reduce a voltage drop and a noise, as shown by a plan view of the Vcc wiring pattern 208 as an example. And the Vcc wiring pattern 208 is directly connected with the receptive terminals 204c of the Vcc circuit changeover socket 204 and the GND wiring pattern 209 is directly connected with the receptive terminals 205c of the GND circuit changeover socket 205.

Thus, the burn-in board 200 according to this embodiment can form, for example, the Vcc wiring circuit by fitting the Vcc circuit changeover unit 206 in the Vcc circuit changeover socket 204A and can form the GND wiring circuit by fitting the GND circuit changeover unit 207 in the GND circuit changeover socket 205B. Therefore, it is possible to easily change over a circuit from a signal wiring to a desired Vcc wiring or GND wiring by preparing the number of Vcc circuit changeover units 206 and the number of GND circuit changeover units 207 which are respectively provided with specific plug-in terminals, corresponding to the number of changeover circuits (kinds of tested devices) and by changing these Vcc circuit changeover units 206 or GND circuit changeover units 207.

The changeover unit of this embodiment has the Vcc circuit changeover unit 206 provided with plug-in terminals 206b and 206c so that the terminals 5 and 7 of the IC socket 202 can be connected with the Vcc power source 210 and has the GND circuit changeover unit 207 provided with plug-in terminals 207b and 207c so that the terminals 12 and 14 of the IC socket 202 can be connected with the GND power source 211. Therefore, in case that it is necessary to change over the Vcc wiring and the GND wiring after a burn-in board has been made, it is possible to easily perform a changeover of the Vcc wiring and the GND wiring by pulling out the Vcc circuit changeover unit 206 and the GND circuit changeover unit 207 which have been previously used, respectively, from the Vcc circuit changeover socket and the GND circuit changeover socket, and then inserting the Vcc circuit changeover unit and the GND circuit changeover unit which have been newly made for changing over the wiring, respectively, into the Vcc circuit changeover socket and the GND circuit changeover socket.

In this embodiment, a Vcc wiring pattern, a GND wiring pattern, and a signal wiring pattern as the circuit wiring on the printed wiring board 201 are respectively formed on different layers. Particularly, therefore, the Vcc wiring pattern and the GND wiring pattern can be made as wide as possible in pattern width and can be formed so as to surround the IC socket 202 in its very close vicinity in order to reduce a voltage drop and a noise. And the Vcc wiring pattern is directly connected with the Vcc terminals 204c of the Vcc circuit changeover sockets 204A and 204B, and the GND wiring pattern is directly connected with the GND terminals 205c of the GND circuit changeover sockets 205A and 205B. Accordingly, since length of the Vcc wiring and that of the GND wiring which have influence upon a noise and a voltage drop come to be only lengths of them inside the Vcc circuit changeover unit and the GND circuit changeover unit, these lengths can be 50 mm or less and can be shorten to 10% or less of the existing wiring length. Thus, a voltage drop and a noise caused by the Vcc wiring and the GND wiring can be reduced by 20% or more of the existing level.

Although the invention has been described with an embodiment of it, the present invention is not limited to the above-mentioned embodiment and can be modified in various manners. In the above-mentioned embodiment, for example, a Vcc circuit changeover socket as a first circuit changeover socket and a GND circuit changeover socket as a second circuit changeover socket are arranged corresponding to the respective terminal lines at both sides of an IC socket 202, but it will do also to arrange only the Vcc circuit changeover socket at one side of the IC socket 202 and only the circuit changeover socket at the other side of the IC socket 202.

As described above, since a burn-in board of the invention is provided with a test circuit changeover means capable of changing the test circuit according to kinds to be tested by selectively changing over an electric potential supplied to the respective test terminals of a tested device accommodating part from a first and a second electric potential supplying means, different tests can be easily performed on different kinds of devices on which a burn-in test is to be performed and which are equal in their package and the number of pins to one another, and since the test circuit changeover means is provided near the tested device accommodating part, length of the wiring having influence upon a voltage drop and a noise can be greatly reduced and an effect of greatly reducing the signal noises can be obtained.

What is claimed is:

1. A burn-in board comprising:
a tested device accommodating part which accommodates tested devices each of which has plural terminals, and which said tested device accommodating part has plural test terminals to be electrically connected with the terminals of the tested devices accommodated in it,
a test signal supplying means for supplying a signal to one set of test terminals of said tested device accommodating part,
a first electric potential supplying means having a solid pattern for supplying a first test electric potential to a second set of test terminals of said tested device accommodating part,
a second electric potential supplying means having a solid pattern for supplying a second test electric potential different from the first test electric potential to a third set of test terminals of said tested device accommodating part,
a test circuit changeover socket, and
a plurality of changeover unit means which can change a test circuit according to kinds of tested devices by selectively inserting one of the plurality of changeover unit means into the test circuit changeover socket to change over the electric potential supplied from said first and said second electric potential supplying means to the respective second or third sets of test terminals of said tested device accommodating part to different sets of test terminals of said tested device accommodating part.

2. A burn-in board comprising:
a tested device accommodating part which accommodates tested devices each of which has plural terminals, and which said tested device accommodating part has plural test terminals to be electrically connected with the terminals of the tested devices accommodated in it,
a test signal supplying means for supplying a signal to one set of test terminals of said tested device accommodating part,
a first electric potential supplying means having a solid pattern for supplying a first test electric potential to another set of test terminals of said tested device accommodating part,
a second electric potential supplying means having a solid pattern for supplying a second test electric potential different from the first test electric potential to said another set of test terminals of said tested device accommodating part, and
a test circuit changeover socket, and
a plurality of changeover unit means which can change a test circuit according to kinds of tested devices by selectively inserting one of the plurality of changeover unit means into the test circuit changeover socket to change over the electric potential supplied from said first and said second electric potential supplying means to other sets of test terminals of said tested device accommodating part, wherein said test circuit changeover socket and plurality of changeover unit means comprises;
a first circuit changeover socket having plural first receptive terminals electrically connected, respectively, with plural test terminals of said tested device accommodating part and a first electric potential terminal electrically connected with a first electric potential supplying means,
a second circuit changeover socket having plural second receptive terminals electrically connected, respectively, with plural test terminals of said tested device accommodating part and a second electric potential terminal electrically connected with a second electric potential supplying means,
a first circuit changeover unit having plug-in terminals for electrically connecting the first electric potential terminals of said first circuit changeover socket with either receptive terminals corresponding to a test circuit out of the first receptive terminals, and a second circuit changeover unit having plug-in terminals for electrically connecting the second electric potential terminals of said second circuit changeover socket with either receptive terminals corresponding to a test circuit out of the second receptive terminals.

3. A burn-in board as defined in claim 2, wherein;

plural test terminals are arranged respectively at both sides of said tested device accommodating part, and said first and said second circuit changeover socket are arranged corresponding to the respective terminal lines at both sides of the tested device accommodating part.

4. A burn-in board as defined in claim 2, wherein;

plural signal wirings corresponding to the test terminals of said tested device accommodating part, a first wiring between said first electric potential supplying means and the first electric potential terminal of said first circuit changeover socket, and a second wiring between said second electric potential supplying means and the second electric potential terminal of said second circuit changeover socket are formed respectively on layers different from one another on the printed wiring board.

5. A burn-in board comprising:

a tested device accommodating part which accommodates tested devices each of which has plural terminals, said part having plural test terminals to be electrically connected with the terminals of the tested devices accommodated in it;

a signal supplying means for supplying a signal to a first set of test terminals of said tested device accommodating part routed to said accommodating part via a solid printed wiring pattern on said board;

a first electric potential supplying means for supplying a first test electric potential to a second set of test terminals of said tested device accommodating part, said first electric potential supplying means being routed in a solid printed wiring pattern on said board;

a second electric potential supplying means for supplying a second test electric potential different from the first electric potential to a third set of test terminals of said tested device accommodating part, said second electric potential supplying means being routed in a solid printed wiring pattern on said board; and a test circuit changeover socket, and a plurality of changeover unit means which can change a test circuit according to kinds of tested devices by selectively inserting one of the plurality of changeover unit means into the test circuit changeover socket to change over the electric potential supplied from said first and said second electric potential supplying means to fourth and fifth sets of test terminals of said tested device accommodating part.

6. A burn in board for testing a plurality of circuit devices mounted thereon, each device being in a device accommodating part mounted on said board, said board comprising:

a circuit board having a printed circuit thereon;

a plurality of device accommodating parts mounted on said board;

a first potential changeover socket mounted on said board;

a second potential changeover socket mounted on said board;

a third potential changeover socket mounted on said board;

a fourth potential changeover socket mounted on said board;

a first electric potential supplying means connected to said circuit for supplying a first potential to first terminals of said first potential changeover sockets and to second terminals of said second potential changeover sockets, said printed circuit connecting said first and second terminals to different terminals of each of said device accommodating parts;

a second electric potential supplying means connected to said circuit for supplying a second potential to first terminals of said third potential changeover sockets and to second terminals of said third potential changeover sockets, said printed circuit connecting said first and second terminals of said third and fourth potential changeover sockets to different terminals of each of said device accommodating parts;

a first circuit changeover connector adapted to mate with either said first or second changeover sockets; and a second circuit changeover connector adapted to mate with either said third or fourth changeover sockets whereby said first electric potential and said second electric potential may be selectively provided to different terminals of said device accommodating parts by positioning said first circuit changeover device in either said first or second changeover sockets and said second changeover device in either said third or fourth changeover sockets.

* * * * *